United States Patent [19]

Sweis et al.

[11] Patent Number: 5,477,611
[45] Date of Patent: Dec. 26, 1995

[54] METHOD OF FORMING INTERFACE BETWEEN DIE AND CHIP CARRIER

[75] Inventors: Jason Sweis, Sunnyvale, Calif.; Kenneth B. Gilleo, West Kingston, R.I.

[73] Assignee: Tessera, Inc., San Jose, Calif.

[21] Appl. No.: 123,882

[22] Filed: Sep. 20, 1993

[51] Int. Cl.$^6$ ..................................................... H05K 3/34
[52] U.S. Cl. .......................... 29/840; 174/52.4; 257/676; 437/219
[58] Field of Search ........................... 29/827; 174/52.2, 174/52.4; 427/96; 437/207, 211, 219; 257/667, 676, 787

[56] References Cited

U.S. PATENT DOCUMENTS

| | | | |
|---|---|---|---|
| 3,906,144 | 9/1975 | Wiley | 257/676 X |
| 4,017,495 | 4/1977 | Jaffe et al. | |
| 4,079,511 | 3/1978 | Grabbe | 174/52.2 X |
| 4,143,456 | 3/1979 | Inoue | 437/219 X |
| 4,163,072 | 7/1979 | Soos | 427/96 |
| 4,829,666 | 5/1989 | Haghiri-Tehrani et al. | 174/52.4 X |
| 4,857,483 | 8/1989 | Steffen et al. | 437/219 X |
| 4,897,534 | 1/1990 | Haghiri-Tehrani | |
| 4,953,173 | 8/1990 | Fujitsu | 174/52.4 X |
| 5,055,913 | 10/1991 | Haghiri-Tehrani | 257/676 |
| 5,130,781 | 7/1992 | Kovac et al. | 174/52.4 X |
| 5,148,265 | 9/1992 | Khandros et al. | |
| 5,350,947 | 9/1994 | Takekawa et al. | |
| 5,394,009 | 2/1995 | Loo | |

FOREIGN PATENT DOCUMENTS

| | | | |
|---|---|---|---|
| 269336 | 6/1988 | European Pat. Off. | 257/676 |
| 56-74951 | 6/1981 | Japan | 257/676 |
| 61-95539 | 5/1986 | Japan | 437/291 |
| 63-53939 | 3/1988 | Japan | 437/219 |

*Primary Examiner*—Carl J. Arbes
*Attorney, Agent, or Firm*—Lerner, David, Littenberg, Krumholz & Mentlik

[57] ABSTRACT

A method for creating an interface between a chip and chip carrier includes spacing the chip a given distance above the chip carrier, and then introducing a liquid in the gap between the chip and carrier. Preferably, the liquid is an elastomer which is hardened into a resilient layer after its introduction into the gap. In another preferred embodiment, the terminals on a chip carrier are planarized or otherwise vertically positioned by deforming the terminals into set vertical locations with a plate, and then hardening a liquid between the chip carrier and chip.

39 Claims, 5 Drawing Sheets

METHOD OF FORMING INTERFACE BETWEEN DIE AND CHIP CARRIER

BACKGROUND OF THE INVENTION

In the construction of semiconductor chip assemblies, it has been found desirable to place elastomeric materials between some of the various components. For example, in some of the structures disclosed in PCT/US91/06920 (filed Sep. 24, 1991) by I. Khandros and T. Distefano, the disclosure of which is incorporated herein by reference, a chip carrier includes a flexible dielectric layer with leads and an array of terminals. The chip carrier is fastened to a semiconductor chip or "die". An elastomeric material is disposed between the chip and the flexible dielectric layer of the chip carrier. The chip carrier and elastomeric material are also referred to as an "interposer". The leads of the chip carrier are bonded to the chip so that the terminals of the carrier are electrically connected to the contacts on the chip. The entire structure can then be mounted to a substrate such as a circuit panel or chip housing. The terminals of the chip carrier are electrically connected to contacts on the substrate. The elastomeric layer provides resiliency to the individual terminals, allowing each terminal to move as necessary to accommodate tolerances during testing and in the final assembly itself.

In some arrangements used heretofore, the elastomeric layer was formed by casting a silicone rubber resin onto a release liner and curing. Next, additional resin was applied to each side of the cured sheet, the additional resin was partially cured, and the resulting tacky adhesive surface was used to bond the elastomeric layer to the chip and chip carrier. Once attached, the entire structure was heated and fully cured.

Although this process is effective, further improvement would be desirable. The components are of small size and require instruments which are capable of handling such small components. Also, air can be occasionally entrapped when the chip carrier and die are affixed to the elastomer layer. The entrapped air can create defects. Accordingly, care must be taken to prevent such entrapment. This adds to the expense of the process.

Accordingly, further improvement would be desirable.

SUMMARY OF THE INVENTION

The present invention addresses these needs. According to one embodiment of the present invention, a method of forming a mounting structure for a semiconductor chip includes placing a chip carrier a given distance above the chip to create a gap between the chip carrier and chip, and introducing a liquid into the gap, such that the liquid is disposed between the chip carrier and the chip.

Preferably, the liquid is a hardenable elastomer, and the method further includes hardening the liquid after the liquid has been introduced into the gap, thereby forming a resilient layer in the gap. The hardening step includes curing the liquid by transmitting radiant energy towards the liquid.

The liquid may be conveyed to the outer edges of the chip carrier, and the hardening step include hardening liquid exposed to the radiant energy at the outer edges of the chip carrier. Further, heat may be applied to thermally cure any liquid which was not cured by the radiant energy.

Alternatively, the hardening step may include heating the liquid, such as by bringing the liquid to between about 100° C. to 150° C., and preferably to about 120° C. On the other hand, the hardening step may include mixing a plurality of mutually reactive materials to form the liquid during or immediately before the introducing step such that the liquid cures by reaction of the materials. If desired, the liquid is heated after the mixing step.

Preferably, the introduction of liquid ceases when an amount of liquid sufficient to reach the edges of the chip carrier has been introduced. The method includes conveying the liquid to edges of the chip carrier after or during the step of introducing the liquid. The conveying step desirably includes forming a meniscus from the outer edges of the chip carrier to the outer edges of the chip, such that surface tension at the meniscus retains the liquid within the gap. The liquid desirably is conveyed to the outer edge of the chip carrier via surface wetting.

The method may also include introducing a predetermined amount of the liquid into the gap by pressurized injection. Further, the liquid may be prevented from passing beyond the outer edge of the chip carrier by disposing a mold immediately adjacent the outer edges of the chip carrier. Alternatively, the outer edges of the chip and chip carrier may be encapsulated by liquid by disposing the mold a spaced distance from the outer edges of the chip carrier, and allowing the liquid to fill the spaced distance.

The liquid may be introduced into the gap between the chip and the chip carrier via an aperture disposed at approximately the center of the chip carrier. A needle is inserted through the aperture to introduce the liquid into the gap.

In another aspect of the present invention, a method is provided for forming an elastomeric layer between a chip and a chip carrier. The chip carrier has edges, leads, and terminals in electrical connection with the leads. The method comprises placing the chip carrier a given distance above the chip to create a gap between the chip carrier and the chip, bonding the leads to the chip. A liquid elastomer into the gap, desirably after the bonding step has been completed, such that the liquid elastomer is disposed between the chip carrier and the chip, and the liquid elastomer is hardened after the liquid elastomer has been introduced into the gap.

Preferably, the leads are in contact with the liquid elastomer when the hardening step begins, and the leads are encased by the liquid elastomer when the hardening step begins.

Desirably, the chip carrier includes a support structure having a central portion and a peripheral portion, and the leads initially extend from the central portion of the support structure to the peripheral portion. The step of placing the chip carrier above the chip may include the step of supporting the peripheral portion of the support structure so that the central portion is supported above the chip by the leads. Further, the bonding step includes detaching the leads from the peripheral portion and connecting the leads to the chip. Preferably, this bonding step is performed serially, such that the central portion is first supported above the chip by connection of the leads to the peripheral portion, then by the connection of some of the leads to the chip and other of the leads to the lead frame, and finally by the connection of the leads to the chip.

The liquid may be partially cured in an initial curing step. The terminals are then displaced to a preselected vertical location after the initial curing step, and finally the liquid is hardened. The displacing of the terminals involves pushing the terminals downward with a plate. On the other hand, the terminals may be vertically located by placing a plate adjacent the terminals before the introducing step, and the introduction of the liquid into the gap forces the terminals upward against the plate.

In yet another aspect of the present invention, a method is provided for positioning a plurality of terminals on one side of a flexible chip carrier layer. The method includes the step of disposing a layer of a flowable material such as a partially cured elastomeric material between the chip carrier layer and a chip such that the flowable layer is disposed beneath the flexible layer and the terminals extend upwardly from the flexible layer, away from the flowable layer. Next, the terminals are pushed towards the chip with a molding plate until the tips of the terminals define a surface which substantially conforms to the shape of the molding plate. During this process, the flowable material flows to accommodate movement of the flexible layer. Finally, the flowable layer is hardened after the pushing step, preferably while the terminals are defining the surface.

Preferably, the molding plate is planar, such that the surface defined by the terminals is planar.

The step of disposing the flexible layer may include placing the flexible layer a given distance above the chip to create a gap between the flexible layer and the chip, introducing a liquid elastomer into the gap, such that the liquid elastomer is disposed between the flexible layer and the chip, and partially curing the liquid elastomer to create a partially cured elastomeric layer. Alternatively, the partially cured but still flowable elastomeric layer may be applied first, and the chip carrier may be applied atop the partially cured layer.

DETAILED DESCRIPTION OF THE PREFERRED EMBODIMENTS

Figure 1:
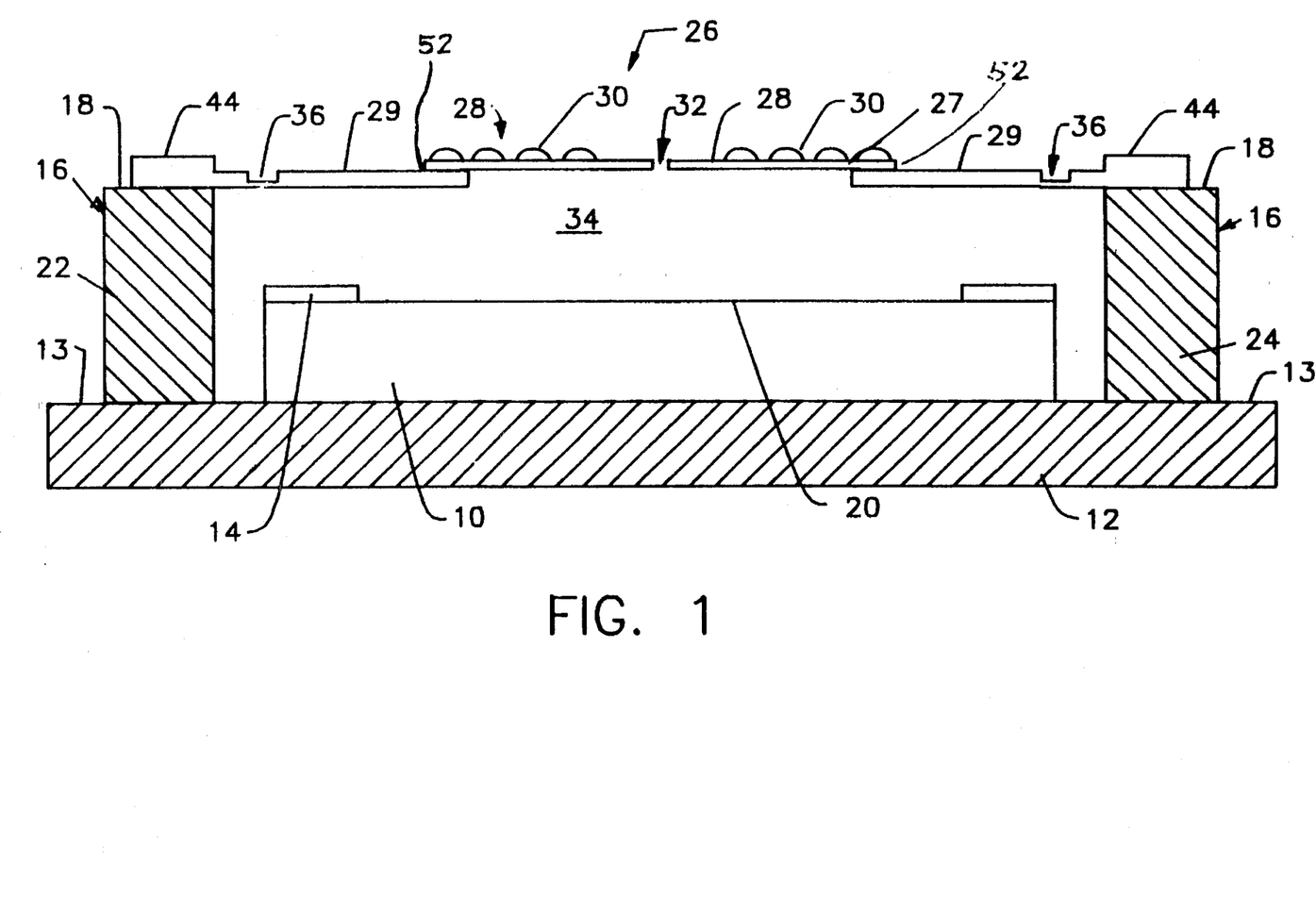
FIG. 1 is a diagrammatic sectional view depicting components during one step of a process in accordance with one embodiment of the present invention.
Figure 2:
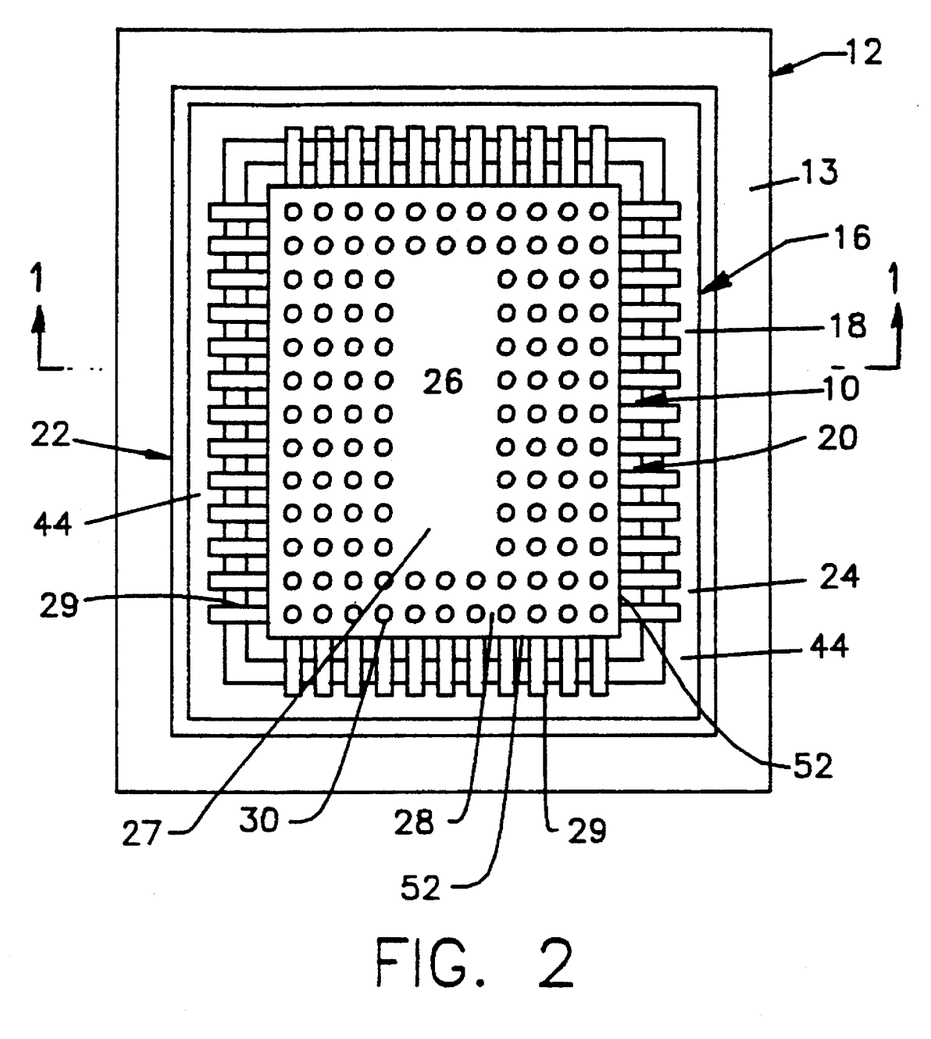
FIG. 2 is a diagrammatic top view depicting components during the same step of the process as seen in FIG. 1.

FIGS. 1 and 2 illustrate the initial stages of one process for forming an interface between a chip carrier and a chip. A chip or die 10 rests on the top side of a support structure 12. The support structure could be any relatively rigid surface, including a moving receptacle, conveyor belt, or the like.

For ease of reference, directions are stated in this disclosure with reference to the top side 20 of chip 10. Generally, directions referred to as "upward" or "rising from" shall refer to the direction orthogonal and away from the chip top surface 20. Directions referred to as "downward" shall refer to the directions orthogonal to the chip top surface 20 and opposite the upward direction. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

Disposed on the top side 20 of chip 10 are contacts 14. These contacts are of the type typically found on an integrated circuit chip.

Also disposed on the top surface 13 of support block 12 is lead frame support 16. Frame support 16 surrounds chip 10, and the top 18 of frame support 16 is higher than the top 20 of chip 10. Desirably, the top 18 of support 16 is about 0.12 mm to about 0.22 mm, and most preferably about 0.18 mm higher than the top 20 of chip 10. Preferably, frame support 16 is a single open rectangular member which surrounds chip 10, the frame support having a left side 22 and a right side 24.

Held on the top 18 of frame support 16 is chip carrier 26. Chip carrier 26 includes a support structure or dielectric layer 28, leads 29, and terminals 30. The dielectric layer or support structure 28 is a thin sheetlike flexible dielectric material, such as polyimide. Dielectric layer 28 includes a central portion 27 and a peripheral portion 44, there being a slot 45 extending between central portion 27 and peripheral portion 44. Central portion 27 defines outer edges 52 bounding slots 45. Peripheral portion 44 overlies the top 18 of support 16. Peripheral portion 44 is clamped by suitable devices (not shown) on support 16. The peripheral portion may be formed as part of a continuous tape incorporating numerous chip carriers. On top of dielectric layer 28 are an array of terminals 30 which are made of an electrically conductive material such as soft gold of high purity.

The terminals 30 are electrically connected to fine wires or leads 29, which are attached to the bottom of the dielectric layer. The leads 29 extend beyond the outer edges of the central portion 27 of the dielectric layer and are releasably connected to the peripheral portion 44 of the layer. In the specific releasable connection shown, each lead has a frangible portion 36 between the outer edges of the dielectric central portion 27 and the connection with peripheral portion 44. Any other form of releasable connection between the lead and the peripheral portion can be employed. Leads with releasable connections including frangible portions are disclosed in some of the structures set forth in co-pending U.S. patent application No. 07/919,772, filed Jul. 24, 1992 (hereinafter "the '772 application"), the disclosure of which is incorporated herein by reference. Other structures including leads having releasable connections are disclosed in the co-pending commonly assigned application of DiStefano, et al. entitled "Semiconductor Connection Components and Methods with Releasable Lead Support and Bus Structure", filed of even date herewith. The disclosure of this application is also incorporated herein by reference.

Thus, chip carrier 26 bridges across the left and right sides (22 and 24) of the frame support 16. The central portion 27 of the support structure or dielectric layer 28 is supported above the chip 10 by connection of the leads 29 to the peripheral section 44 of the dielectric layer overlying frame support 16. The outer edges 52 of the chip carrier support structure central portion 27 extend generally parallel to the outer edges 54 of chip 10 but slightly inboard thereof. Because top 18 of lead support frame 16 is higher than the top 20 of chip 10, the chip carrier 26 will remain a given distance or height above chip 10, forming a gap 34. The height of gap 34 is desirably between about 0.12 mm to 0.22 mm, and preferably about 0.18 mm. Disposed at the center of chip carrier 26 is a small aperture 32 which communicates with gap 34. The diameter of aperture 32 is desirably between about 0.25 mm and several millimeters, and preferably is about 3 mm.

Figure 3:
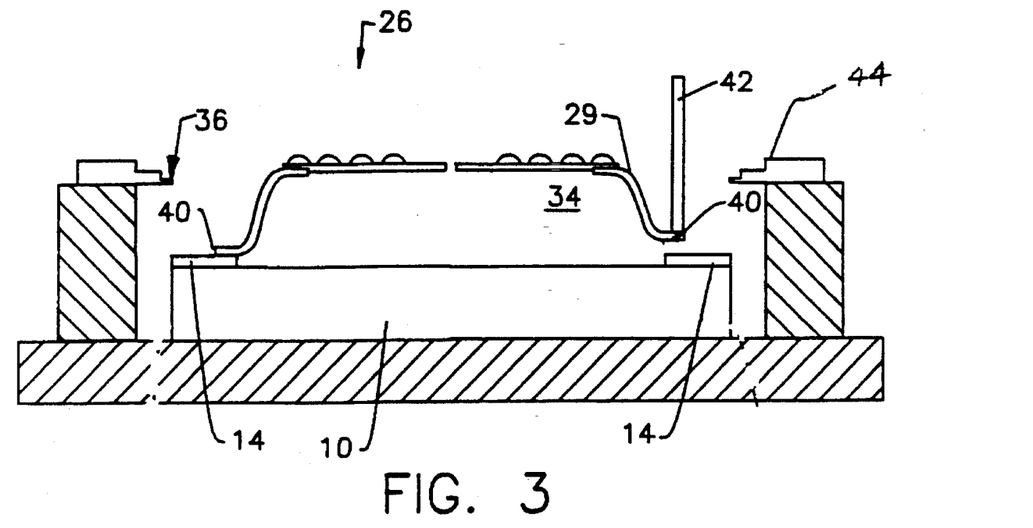
FIG. 3 is a diagrammatic sectional view depicting components during a later step of the process of FIGS. 1–2.

After chip assembly is placed in its initial stages as shown in FIGS. 1 and 2, the leads 29 are bonded to the contact pads 14 of chip 10, as shown in FIG. 3. A tool 42, such as that disclosed in the '772 application mentioned above, grasps lead 29 at weakened portion 36. Tool 42 pushes lead 29 down, simultaneously holding end 40 of lead 29 as it breaks the lead at weakened portion 36. Tool 42 moves end 40 towards contact pad 14, and eventually bonds the lead to the contact pad 14. Preferably, tool 42 bends lead 29 into an "S" shape by moving end 40 toward they central portion 27 of the support structure as end 40 is moved downward, rather than simply bending the lead toward the contact pad. An example of an "S"-shaped lead is disclosed in some of the structures set forth in the co-pending, commonly assigned U.S. patent application entitled "Shaped Lead Structure and Method" of Kenneth Gilleo, et al. filed of even date herewith, the disclosure of which is incorporated herein by reference.

The leads 29 are detached from peripheral portion 44 serially, such that no more than a few leads 29, and preferably only one lead, is or are being separated from peripheral portion 44 at any given moment. Therefore, the leads 29 will be gradually bonded to contact 14, rather than bonding all of the leads simultaneously. Because of this gradual connection, the central portion 27 of the support structure or dielectric layer 28 will maintain its distance above chip 10. At any moment in time, the central portion 27 of the chip carrier dielectric layer will be supported by either the leads bonded to the contact pad 14 or by the leads which remain connected to the peripheral portion 44. In fact, the "S" shape of the connection of the leads to the contacts 14 is extremely effective in supporting chip carrier 26 above chip 10. Eventually, all the leads will be severed from peripheral portion 44, and central portion of chip carrier 26 will be entirely supported by the connection of leads 29 to contact pads 14.

Figure 4:
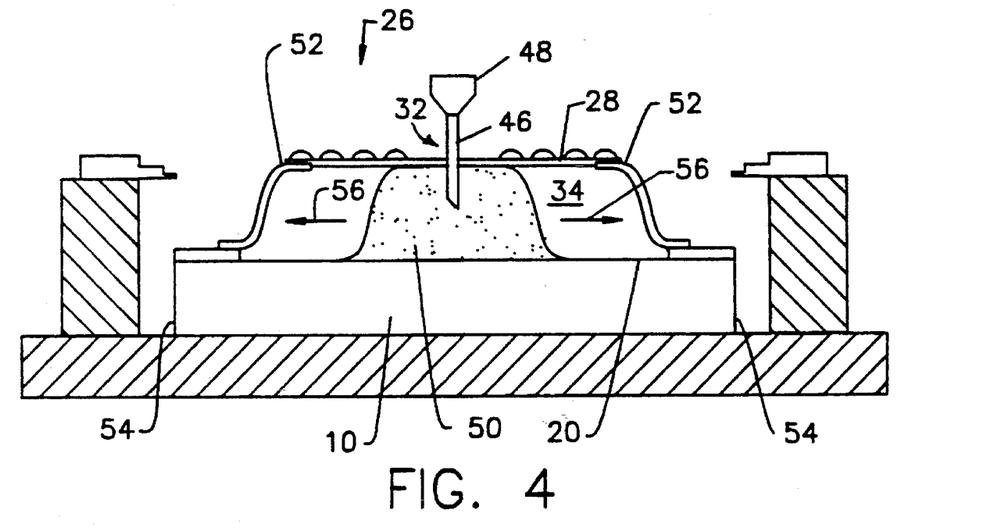
FIG. 4 is a diagrammatic sectional view depicting components during another later step of the process of FIGS. 1–3.

FIG. 4 illustrates the injection of a liquid into gap 34 after the leads have been bonded to chip 10. One end of a thin hollow needle 46 is inserted through aperture 32 into gap 34. Preferably, the needle is a 30 gauge. The other end of needle 46 is connected to a source of liquid, which is preferably a hardenable elastomer such as silicone rubber. In operation, source 48 applies enough pressure to cause liquid elastomer 50 enter gap region 34.

Next, the liquid elastomer is conveyed to the outer edges 52 of chip carrier central portion 27 and the outer edges 54 of chip 10. Although the present invention is not limited by any theory of operation, it is preferable for liquid to be conveyed to the outer edges by the capillary-like relationship of the liquid to the chip and chip carrier central portion. For example, the surface tension of the liquid elastomer 50 should be low enough such that the liquid spreads along the surfaces of the chip and chip carrier upon its introduction. That is, the liquid should wet both the chip carrier and the chip. Such wetting of the surfaces facing gap 34 will cause the liquid to spread through the gap, away from aperture 32 and towards the outer edges of the chip and chip carrier. This movement is illustrated by flow directions 56 in FIG. 4. Due to the relative surface tensions, the angle of contact between the advancing edge of the liquid and the chip and chip carrier will be maintained as the liquid flows. It is further contemplated that due to the tendency of the liquid to wet the surfaces, the liquid will be "pulled" out of the needle 46, and little or no pressure at source 48 will be necessary to supply liquid to the gap. However, some initial pressure will have to applied in order to bring some of the liquid out of the needle and into contact with the surfaces facing gap 34. Further, if the liquid is viscous, some pressure will aid filling the cavity more rapidly than if no pressure was applied.

Figure 5:
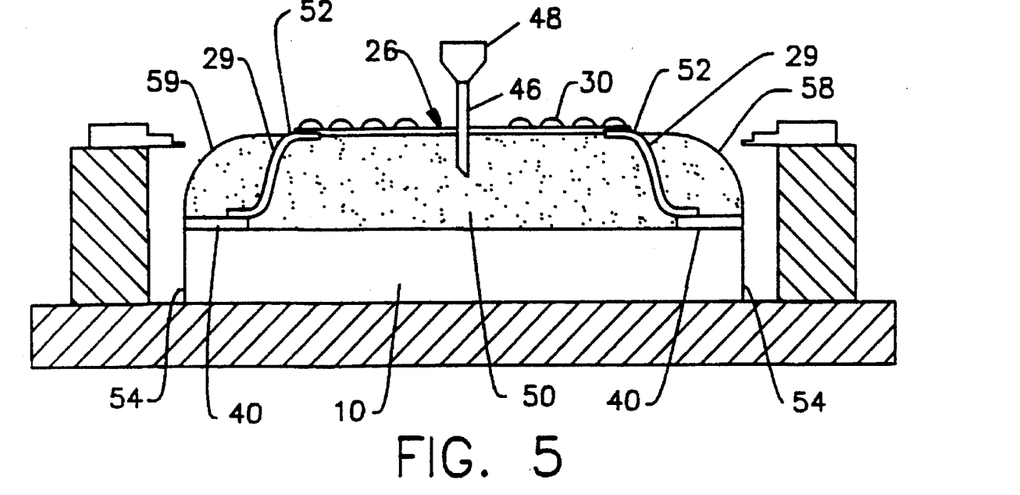
FIG. 5 is a diagrammatic sectional view depicting components during yet another later step of the process of FIGS. 1–4.

As shown in FIG. 5, the liquid will continue flowing along the top 20 of chip 10 and along the bottom of the dielectric layer 28 until it reaches the edges of the chip carrier and chip. Due to the surface tension in the advancing edge of liquid 50, the liquid will cease moving in directions 56 when it encounters a well-defined edge. Thus, the liquid elastomer 50 will completely fill gap 34, and stop at outer edge 54 of chip 10. Additionally, the liquid will also tend to stop at the outer edge 52 of chip carrier central portion 27.

The surface of the liquid will form a meniscus 59 between the outer edges 54 and 52 of the chip and chip carrier central portion. Surface tension will restrain the liquid 50 from proceeding beyond the boundaries of the chip or chip carrier. The liquid elastomer will also encapsulate leads 29 and contact pads 40 once the liquid elastomer 50 has reached the outer edges of the chip and chip carrier. Once the liquid reaches these edges, needle 46 will be withdrawn from gap 34.

In essence, the introduction of liquid into gap 34 is self-regulating. The tendency of the liquid to wet the surfaces will end when the liquid reaches the edges of the chip and chip carrier. The cessation of wetting will prevent further liquid from being drawn from needle 46.

Once the liquid 50 has flowed to the edges of the chip and chip carrier, the liquid is cured in order to harden it into an elastomeric layer. For example, one method of curing would include polymerizing the liquid by applying thermal energy to the entire unit of chip carrier 26, elastomer 50 and chip 10. For example, with an elastomeric liquid elastomer composed of catalyzed silicone resin applying 140° C. for ten minutes should sufficiently harden the elastomeric material. As defined in this disclosure, a "hardened" element should be understood to mean that an element which maintains its shape independent of the container. Accordingly, while the elastomer is "hardened", it will maintain resilient characteristics.

Once the elastomeric layer 50 has been cured, the assembly is complete. Chip carrier 26 will have a layer of elastomeric material 50 between it and the chip 10, providing terminals 30 with a sufficient degree of resiliency. Such resiliency is particularly advantageous when the tops or tips of some terminals 30 are higher than the tips of other terminals. For example, if a test probe or substrate with ideally planar contacts is placed on a chip carrier with terminals of varying heights, the resiliency of the elastomeric layer 50 will allow all of the terminals to come in contact with the corresponding probe's contacts, no matter what the height of the terminal. In other words, the higher terminals will be pushed downward until all of the terminals contact the probe's contacts.

This method of creating an elastomeric layer is especially advantageous in that it does not entrap any air between the elastomer and chip carrier or chip. In the present method, the outward flow of the liquid elastomer prevents the creation of air bubbles.

In addition, the liquid elastomer will conform to the shape and size of the chip 10 and chip carrier, no matter what that shape may be.

In addition to the preferred embodiment discussed above, the present invention allows for a great amount of variety in implementation. For example, rather than utilizing the principle of wetting, alternative methods may be used to fill the gap 34 and cause the liquid elastomer 50 to flow towards the outer edges of the chip carrier and chip. Specifically, a predetermined amount of liquid elastomer could be introduced into the gap by pressurized injection, thus pushing the liquid elastomer towards the outer edges of the chip and chip carrier in spite of the relative surface tensions of the components. Because meniscus 59 will stretch with the introduction of liquid into the gap, the meniscus provides a great deal of leeway in the amount of liquid which may be injected into the gap. If pressurized injection is used, it is preferably to include some means for preventing the liquid from passing through the gap between the needle and the dielectric layer. For example, an annular rubber seal on the needle could close off the gap during injection.

Figure 6:
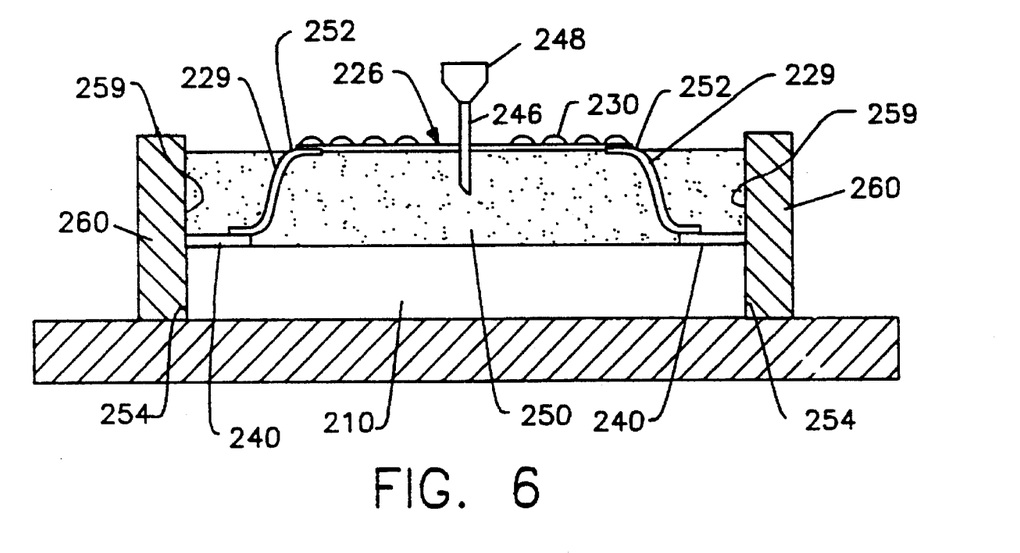
FIG. 6 is a diagrammatic sectional view depicting components during one step of a process in accordance with another embodiment of the present invention.

Instead of relying upon the surface tension of the liquid to prevent the elastomer from passing beyond the edges of the assembly, a mold could be used to keep the liquid in place. For example, as shown in FIG. 6, after the leads 229 have been severed from the peripheral portion of the dielectric layer (not shown), the peripheral portion and the support could be removed and replaced with a mold 260. The inside edges 259 of the mold 260 would directly abut the outer edges 254 of chip 210. As the liquid elastomer is forced into the gap between chip carrier 226 and chip 210, the liquid elastomer 250 will reach the inner edges 259 of the mold 260. A meniscus would form between the outer edges of the chip carrier and the top of the mold to prevent the liquid from spilling over the mold. With the outer edges of the elastomer material 250 thus defined, the elastomer is cured with the mold in place, and then the mold 260 is removed. The elastomer, now in its cured and hardened state, would retain the shape it had while within the mold.

If desired, the outer edges of the chip and chip carrier could be encapsulated by the elastomer if the mold is placed a distance away from the outer edges of the components. Specifically, the liquid is forced to spill over the edges of the chip and chip carrier, and into the gap between chip carrier and mold. Afterwards, the liquid is hardened and the mold removed. The elastomer would thus encapsulate the sides of the assembly.

Various methods are also available to cure the liquid elastomer while it is within the gap between the chip carrier and the chip. For example, the elastomer may be a liquid elastomer which is curable by radiant energy such as ultraviolet light. The entire assembly of chip carrier, elastomer and chip can be irradiated with the radiant energy. The portions of the liquid elastomer which are exposed to the energy, i.e., the meniscus 59 (FIG. 5), will cure and harden. Other portions of the liquid elastomer will be shielded from the energy by chip carrier 26 and chip 10, and will remain uncured. However, the uncured portion of the liquid will be encased by the hardened meniscus 59, chip carrier 26 and chip 10. Therefore, the uncured portion of elastomer 50 can be cured at a later time by other means, such as by heating the entire assembly.

The method of curing may be a function of the composition of the liquid. For example, if it is desired to cure the elastomer in the presence of heat, two mutually-reactive materials may be premixed to form the liquid elastomer such that the entire composition cures over time, but much more rapidly in the presence of heat. On the other hand, the elastomer could be formed from highly-reactive materials mixed immediately before its injection into the gap. These materials would then quickly react in situ, hardening in place without the need of further curing methods. In other words, this combination of metering, mixing, and dispensing is a form of low pressure reactive injection molding (RIM). If desirable, the assembly may be heated immediately after the elastomer reaches the edges of the chip carrier and chip, thus rapidly decreasing the total time required to cure the elastomer.

Figure 7:
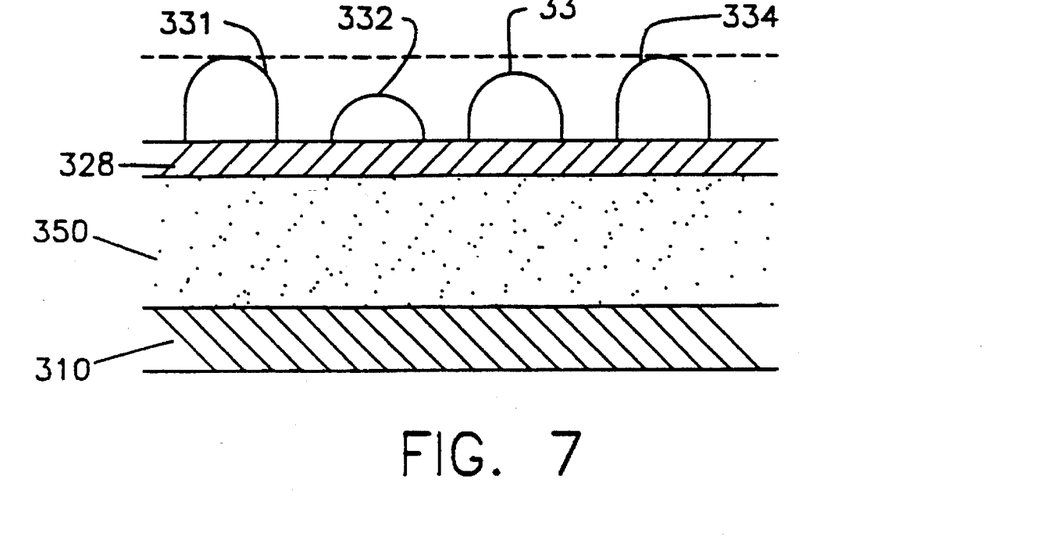
FIG. 7 is a fragmentary diagrammatic sectional view depicting components during one step of a process in accordance with yet another embodiment of the present invention.
Figure 8:
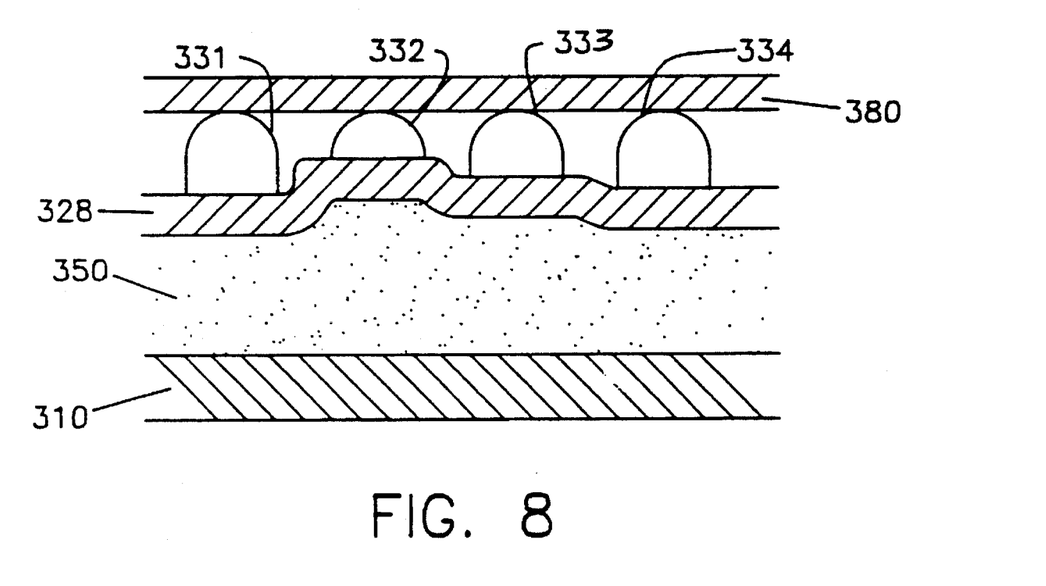
FIG. 8 is a fragmentary diagrammatic sectional view depicting components during a later step of a process in accordance with said yet another embodiment of the present invention.

As discussed above, the resiliency of the elastomeric layer will allow vertical movement of the terminals to accommodate unequal terminal heights during testing and/or final assembly. In a further embodiment of the invention, the terminal heights may be equalized before testing or final assembly. Specifically, as shown in FIG. 7, terminals 331–334 may be of varying heights when affixed to dielectric layer 328 (the scales of FIGS. 7 and 8 are out of proportion for ease of reference). A liquid elastomer 350 is introduced in the gap between dielectric layer 328 and chip 310 in any of the methods discussed above. However, rather than immediately hardening the elastomer after its introduction between the dielectric layer 328 and chip 310, the material is only partially cured or "B-staged". This leaves the material in a quasiliquid state, such as a gel. In the gel or quasiliquid state, the material will flow and undergo permanent deformation upon application of external force, but desirably will not flow under its own weight. Next, as shown in FIG. 8, a planar plate 380 pushes down on the tips of terminals 331–334, causing the higher terminals such as 331 and 334 to be pushed towards chip 310 and into deformable flowable elastomer 350. Plate 380 will continue pushing downward until all of the terminals 331–334 are in contact with the plate. The elastomer 350 is then cured and hardened with the plate 380 maintaining its contacts with the terminals. At this point, the plate 380 can be removed, and the tips of the terminals 331–334 will maintain their position due to the now hardened elastomer 350. Accordingly, the tips of the terminals will be planarized, but still capable of resilient motion towards and away from the elastomeric layer. Of course, instead of pushing plate 380 downwards, it is also possible to push the entire assembly upwards towards a stationary plate.

If a non-planar terminal height is preferred, a plate of any non-planar shape could be used to set the heights of the terminals. In other words, rather than being "planarized", the tips of the terminals can be more generally "verticalized" to define nearly any shaped surface area. If it is desirable for the terminals closer to the outer edges of the chip carrier to be higher than the terminals closer to the center of the chip carrier, a convex plate could be used to vertically locate the outer terminals higher than the inner terminals.

Instead of pushing the terminals down while a partially cured elastomer 350 is in place, it is also possible to bring plate 380 in contact with the terminals before the liquid is introduced. Specifically, the plate 380 is first brought in contact with the highest terminals 331 and 334. Next, pressurized liquid is introduced into the gap, and the pressure of the liquid is used to push the dielectric layer and the shorter terminals up towards the stationary plate. The terminals will cease moving towards the plate when they reach the plate's surface. The liquid is cured with the plate in place, and when the plate is removed, the vertical location of the terminals will retain the shape of the plate.

Also, rather than introducing the liquid under pressure and bringing the plate downwards, it is contemplated that the surface tension of the liquid alone may be sufficient to planarize the terminals against the plate. If the dielectric layer is sufficiently flexible, the surface tension of the liquid will tend to deform the liquid and dielectric layer into a hemispherical shape, absent outside forces. By placing the plate immediately above the chip carrier and then introducing the liquid, the liquid will still tend to bulge hemispherically, but is stopped by the presence of the plate immediately above the chip carrier (see FIG. 8). Accordingly, the tendency of the liquid towards a hemispherical shape will push the chip carrier against the flat adjacent plate, thus planarizing the terminals.

The introduction of a liquid into the gap is not required in order to planarize the terminals in accordance with the present invention. For example, a preformed sheet of partially cured elastomer may be placed between the chip and chip carrier, the terminals then vertically located with a molding plate, and finally the partially cured elastomer sheet is hardened or B-staged. While this method does not have the unique advantages of forming an elastomeric layer by introducing a liquid in between the chip and chip carrier, it does retain the advantages of planarizing terminals in accordance with the present invention.

Although the invention herein has been described with reference to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed is:

1. A method of forming a mounting structure for a semiconductor chip comprising the steps of providing a flexible chip carrier having a top surface and a bottom surface terminals disposed on said top surface and leads in electrical connection with said terminals, placing said chip carrier a given distance above said chip to create a gap between said chip carrier and said chip, said bottom surface facing said chip;

bonding said leads to said chip; and introducing a liquid into said gap, such that said liquid is disposed between said chip carrier and said chip.

2. The method of claim 1 wherein said liquid is a hardenable elastomer.

3. The method of claim 2 further comprising the step of hardening said liquid after said liquid has been introduced into said gap to thereby form a resilient layer in said gap such that said terminals may be flexibly displaced towards and away from said chip.

4. The method of claim 3 wherein said hardening step includes curing said liquid by transmitting radiant energy towards said liquid.

5. A method of forming a mounting structure for a semi-conductor chip comprising the steps of placing a chip carrier a given distance above said chip to create a gap between said chip carrier and said chip introducing a hardenable elastomer liquid into said gap, such that said liquid is disposed between said chip carrier and said chip; and hardening said liquid after said liquid has been introduced into said gap to thereby form a resilient layer in said gap, said hardening comprising curing said liquid by transmitting radiant energy towards said liquid.

6. The method of claim 4 or 5 wherein said introducing step includes the step of conveying said liquid to the outer edges of said chip carrier, and wherein said hardening step includes the step of hardening liquid exposed to said radiant energy at the outer edges of said chip carrier 7. The method of claim 6 further comprising the step of applying heat to thermally cure any liquid which was not cured by said radiant energy.

8. The method of claim 3 wherein said hardening step includes heating said liquid.

9. The method of claim 8 wherein said heating step includes the step of bringing said liquid to between about 100° C. to 150° C.

10. The method of claim 3 wherein said hardening step comprises mixing a plurality of mutually reactive materials to form said liquid during or immediately before said introducing step such that said liquid cures by reaction of said materials.

11. The method of claim 10 wherein said liquid is heated after said mixing step.

12. The method of claim 3 further comprising the step of ceasing said introducing step when an amount of liquid sufficient to reach the outer edges of said chip carrier has been introduced.

13. The method of claim 3 further comprising the step of conveying said liquid to said outer edges of said chip carrier after or during said introducing step.

14. The method of claim 13 wherein said conveying step includes said liquid forming a meniscus from said outer edges of said chip carrier to said outer edges of said chip, such that said meniscus retains said liquid within said gap.

15. The method of claim 14 wherein said conveying step includes conveying said liquid to said outer edges of said chip carrier via surface wetting.

16. The method of claim 13 wherein said introducing step includes introducing a predetermined amount of liquid into said gap by pressurized injection.

17. The method of claim 13 further comprising preventing said liquid from passing beyond said outer edges of said chip carrier by disposing a mold immediately adjacent said outer edges of said chip carrier.

18. The method of claim 13 further comprising encapsulating said outer edges of said chip carrier and chip by disposing a mold a spaced distance from said outer edges of said chip carrier and introducing said liquid into said spaced distance.

19. The method of claim 3 wherein said introducing step includes introducing said liquid into said gap via an aperture disposed at approximately the center of the chip carrier as defined by said outer edges of said chip carrier.

20. The method of claim 19 wherein said introducing step includes inserting a needle through said aperture to introduce said liquid into said gap.

21. The method of claim 3 wherein said given distance of said gap is between about 5 to 9 mils.

22. The method of claim 21 wherein said given distance of said gap is about 7 mil.

23. A method of forming an elastomeric layer between a chip and a chip carrier having a top and bottom surface, terminals disposed on said top surface, and leads in electrical connection with said terminals, said method comprising the steps of placing said chip carrier a given distance above said chip to create a gap between said chip carrier and said chip, said bottom surface of said chip carrier facing said chip, bonding said leads to said chip, introducing a liquid elastomer into said gap, such that said liquid elastomer is disposed between said chip carrier and said chip, and hardening said liquid elastomer after said liquid elastomer has been introduced into said gap.

24. The method of claim 23 wherein said leads are in contact with said liquid elastomer when said hardening step begins.

25. The method of claim 24 wherein said leads are encased by said liquid elastomer when said hardening step begins.

26. The method of claim 23 wherein said chip carrier includes a support structure having a central portion bearing said terminals and a peripheral portion, said leads initially extending from said central portion to said peripheral portion, said placing step comprising the step of supporting said peripheral portion so that said central portion of said support structure lies above said chip, said bonding step including the step of detaching said leads from said peripheral portion and connecting said leads to said chip.

27. A method of forming an elastomeric layer between a chip and a chip carrier having leads, and terminals in electrical connection with said leads, said chip carrier including a support structure having a central portion bearing said terminals and a peripheral portion, said leads initially extending from said central portion to said peripheral portion, said method comprising the steps of placing said chip carrier a given distance above said chip to create a gap between said chip carrier and said chip, said placing including supporting said peripheral portion so that said central portion of said support structure lies above said chip;

bonding said leads to said chip including detaching said leads from said peripheral portion and connecting said leads to said chip;

introducing a liquid elastomer into said gap, such that said liquid elastomer is disposed between said chip carrier and said chip, and hardening said liquid elastomer after said liquid elastomer has been introduced into said gap.

28. The method of claim 25 or 27 wherein said bonding step includes detaching said leads serially, such that said central portion of said support structure is first supported above said chip by connection of said leads to said peripheral portion, then by the connection of some of said leads to said chip and some of the other leads to said peripheral portion, and finally by the connection of said leads to said chip.

29. The method of claim 23
wherein said hardening step includes the steps of partially curing said liquid in an initial curing step and then finally hardening said partially cured liquid,
the method further comprising the step of displacing said terminals to a preselected vertical location after said initial curing step and before said hardening step 30. A method of forming an elastomeric layer between a chip and a chip carrier having leads, and terminals in electrical connection with said leads, said method comprising the steps of placing said chip carrier a given distance above said chip to create a gap between said chip carrier and said chip, bonding said leads to said chip, introducing a liquid elastomer into said gap, such that said liquid elastomer is disposed between said chip carrier and said chip, hardening said liquid elastomer after said liquid elastomer has been introduced into said gap, said hardening including partially curing said liquid in an initial curing step and then finally hardening said partially cured liquid, and displacing said terminals to a preselected vertical location after said initial curing step and before said hardening step.

31. The method of claim 29 or 30 wherein said displacing step comprises pushing said terminals downward with a plate.

32. The method of claim 23 further comprising the step of controlling said vertical location of said terminals by placing a plate adjacent said terminals before said introducing step, such that the introduction of said liquid within said gap forces said terminals upward against said plate.

33. A method of positioning a plurality of terminals on one side of a flexible chip carrier layer, said method comprising the steps of disposing a partially cured layer of flowable material between said chip carrier layer and a chip such that said layer of flowable material is disposed beneath said flexible layer and said terminals extend upwardly from said flexible layer away from said layer if flowable material, pushing said terminals towards said chip with a molding plate until the tips of said terminals define a surface which substantially conforms to the shape of said molding plate, hardening said layer of flowable material after said pushing step while said terminals are defining said surface.

34. A method as claimed in claim 33 wherein said flowable material forms an elastomer during said hardening step.

35. A method as claimed in claim 34 wherein said flowable material is partially cured but remains flowable prior to said pushing step.

36. The method of claim 33 wherein said molding plate is planar, whereby said surface defined by said terminals will be planar.

37. The method of claim 36 wherein said disposing step comprises placing said flexible layer a given distance above said chip to create a gap between said flexible layer and said chip, introducing a liquid elastomer into said gap, such that said liquid elastomer is disposed between said flexible layer and said chip, and partially curing said liquid elastomer to create a partially cured but flowable elastomeric layer.

38. A method of forming a mounting structure for a semi-conductor chip comprising the steps of placing a chip carrier having outer edges a given distance above said chip to create a gap between said chip carrier and said chip;

introducing a hardenable elastomer liquid into said gap, such that said liquid is disposed between said chip carrier and said chip;

hardening said liquid after said liquid has been introduced into said gap to thereby form a resilient layer in said gap; and ceasing said introducing step when an amount of liquid sufficient to reach said outer edges of said chip carrier has been introduced.

39. A method of forming an elastomeric layer between a chip and a chip carrier having leads, and terminals in electrical connection with said leads, said method comprising the steps of placing said chip carrier a given distance above said chip to create a gap between said chip carrier and said chip, bonding said leads to said chip, introducing a liquid elastomer into said gap, such that said liquid elastomer is disposed between said chip carrier and said chip, hardening said liquid elastomer after said liquid elastomer has been introduced into said gap, and controlling said vertical location of said terminals by placing a plate adjacent said terminals before said introducing step, such that the introduction of said liquid within said gap forces said terminals upward against said plate.

* * * * *

UNITED STATES PATENT AND TRADEMARK OFFICE
CERTIFICATE OF CORRECTION

PATENT NO.   : 5,477,611
DATED        : December 26, 1995
INVENTOR(S)  : Jason Sweis and Kenneth B. Gilleo It is certified that error appears in the above-identified patent and that said Letters Patent is hereby corrected as shown below:

Column 11, line 31 change "claim 25" to read -- claim 26 --.
Column 11, line 46 after the words "hardening step", insert a period.

Signed and Sealed this

Second Day of April, 1996

*Attest:*

BRUCE LEHMAN

*Attesting Officer*  *Commissioner of Patents and Trademarks*